(12) United States Patent
Karasawa et al.

(10) Patent No.: US 9,820,412 B2
(45) Date of Patent: Nov. 14, 2017

(54) MODULAR DATA CENTER (71) Applicant: FUJITSU LIMITED, Kawasaki-shi, Kanagawa (JP)

(72) Inventors: Kazuaki Karasawa, Hadano (JP); Masatoshi Ogawa, Isehara (JP); Hiroshi Endo, Isehara (JP); Takahiro Arioka, Isehara (JP); Shigeyoshi Umemiya, Fujisawa (JP); Yoshio Kikuchi, Naka (JP); Shino Tokuyo, Sagamihara (JP); Hiroyuki Fukuda, Yokohama (JP); Masao Kondo, Sagamihara (JP); Hiroaki Yoshida, Isehara (JP); Ayasa So, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 305 days.

(21) Appl. No.: 14/858,021

(22) Filed: Sep. 18, 2015

(65) Prior Publication Data
US 2016/0007506 A1 Jan. 7, 2016

Related U.S. Application Data (63) Continuation of application No. PCT/JP2013/057592, filed on Mar. 18, 2013.

(51) Int. Cl.
G05D 23/00 (2006.01)
H05K 5/00 (2006.01)
(Continued)

(52) U.S. Cl.
CPC ......... H05K 7/20836 (2013.01); G06F 1/206 (2013.01); H05K 7/20736 (2013.01); H05K 7/20745 (2013.01)

(58) Field of Classification Search
CPC .............. G06F 1/206; H05K 7/20736; H05K 7/20745; H05K 7/20836
(Continued)

(56) References Cited

U.S. PATENT DOCUMENTS 5,934,368 A    8/1999  Tanaka et al.
8,949,632 B2 * 2/2015  Kobayashi ......... H05K 7/20836
                                              713/300
(Continued)

FOREIGN PATENT DOCUMENTS

JP    08-088493       4/1996
JP    2010-223487    10/2010
(Continued)

OTHER PUBLICATIONS

International Search Report, mailed in connection with PCT/JP2013/057592 and dated May 28, 2013 (2 pages).

Primary Examiner — Henry Crenshaw
(74) Attorney, Agent, or Firm — Fujitsu Patent Center (57) ABSTRACT A modular data center includes: a rack which houses an electronic device; a blower device capable of switching a flowing direction of air and configured to feed the air into the rack; a space housing a moisture absorbent; an in-rack temperature detector which detects a temperature inside the rack; a dew-point temperature detector which detects a dew-point temperature of outside air; and a controller. The controller receives signals inputted from the in-rack temperature detector and the dew-point temperature detector, and controls shutters and the blower device.

6 Claims, 6 Drawing Sheets (51) Int. Cl.
*G06F 1/16* (2006.01)
*H05K 7/20* (2006.01)
*G06F 1/20* (2006.01)

(58) Field of Classification Search
USPC ....... 700/300; 62/259.2; 454/184; 361/679.4
See application file for complete search history.

(56) References Cited

U.S. PATENT DOCUMENTS

| | | | | |
|---|---|---|---|---|
| 2002/0100579 | A1* | 8/2002 | Heikkila | H05K 7/20736 165/104.34 |
| 2011/0217916 | A1* | 9/2011 | De Zen | H05K 7/20745 454/184 |
| 2011/0239683 | A1* | 10/2011 | Czamara | H05K 7/20745 62/259.4 |
| 2011/0279976 | A1* | 11/2011 | Mikami | G06F 1/20 361/696 |
| 2011/0290448 | A1* | 12/2011 | Campbell | F28D 1/0471 165/104.13 |
| 2012/0155027 | A1* | 6/2012 | Broome | H05K 7/1497 361/696 |
| 2012/0168119 | A1* | 7/2012 | Dunnavant | F24F 3/14 165/59 |
| 2013/0283837 | A1* | 10/2013 | Takahashi | F24F 1/022 62/238.6 |
| 2014/0355203 | A1* | 12/2014 | Kondo | H05K 7/20745 361/679.51 |

FOREIGN PATENT DOCUMENTS

| | | |
|---|---|---|
| JP | 2012-053747 | 3/2012 |
| JP | 2012-097945 | 5/2012 |
| JP | 2012-220107 | 11/2012 |
| JP | 2013-047577 | 3/2013 |

* cited by examiner

MODULAR DATA CENTER

CROSS-REFERENCE TO RELATED APPLICATION

This application is a continuation of International Patent Application No. PCT/JP2013/057592 filed Mar. 18, 2013 and designated the U.S., the entire contents of which are incorporated herein by reference.

FIELD

The embodiments discussed herein are related to a modular data center.

BACKGROUND

With the advent of an advanced information society in recent years, an amount of data treated by computers has been increasing and there has been a growing need for data centers which perform total management of numerous computers.

A data center in general is equipped with a building constructed on a huge land, a large-scale air-conditioning system, and a large-scale electric system. For this reason, such a data center needs a long time to be completed and, therefore, has a difficulty in quickly responding to an increase or decrease in demand. Against this background, modular data centers have been developed and put to practical use. Here, a typical modular data center is formed by arranging racks which house computers (servers), together with an air-conditioning system and an electric system, in a unitized structure of a given size called a container.

Meanwhile, each computer generates a large amount of heat in association with operation. A rise in temperature inside the computer may cause a malfunction, a failure, or a decline in performance and it is therefore preferable to provide a measure for cooling the computers. In a typical data center, low-temperature air is supplied into a room by using an air-conditioning machine (an air conditioner) and then the air in the room is introduced into the computers by cooling fans (blowers), thereby cooling electronic components inside the computers.

In recent years, there has been an ever-growing demand for reduction in power consumption of data centers from the viewpoint of energy conservation. For this reason, there are many modular data centers which adopt an outside air cooling method designed to cool computers by use of outside air. A modular data center of this type does not have to use a large-size air conditioning machine which consumes a large amount of electricity. As a consequence, power used for cooling the computers is reduced.

Modular data centers adopting the outside air cooling method include one configured to introduce low-temperature outside air directly from an intake port into a container, and one configured to cool the air in a container with outside cool air by using a heat exchanger.

Note that techniques relating to the present application are disclosed in Japanese Laid-open Patent Publication Nos. 2012-53747 and 2012-97945.

SUMMARY

According to an aspect of the disclosed technique, there is provided a modular data center which includes: a structure provided with an intake port and an exhaust port, the ports being connected to outside; a first shutter provided to the intake port, and made openable and closable; a second shutter provided to the exhaust port, and made openable and closable; a rack disposed in the structure and configured to house an electronic device; a blower device capable of switching a flowing direction of air, the blower device being disposed in the structure and configured to feed the air into the rack; a first space provided between the first shutter and the rack; a second space provided on an opposite side of the rack from the first space; a third space provided between the second space and the second shutter; a fourth space located adjacent to the second space and the third space, and housing a moisture absorbent inside; a third shutter provided between the second space and the third space, and made openable and closable; a fourth shutter provided between the second space and the fourth space, and made openable and closable; a fifth shutter provided between the third space and the fourth space, and made openable and closable; an in-rack temperature detector configured to detect a temperature inside the rack; a dew-point temperature detector configured to detect a dew-point temperature of outside air; and a controller configured to receive signals inputted from the in-rack temperature detector and the dew-point temperature detector, and to control the first shutter, the second shutter, the third shutter, the fourth shutter, the fifth shutter, and the blower device.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before descriptions are provided for an embodiment, a prelude for facilitating the understanding of the embodiment will be explained below.

As described previously, many modular data centers adopt the outside air cooling method. However, the outside air cooling method has the following problem.

When a modular data center is installed in a cold region, for example, a temperature of a computer in a stopped state may fall below an outside temperature. In such a case, if outside air is introduced into a container, dew condensation may occur inside the computer and may lead to a failure such as a short circuit when the computer is operated.

The following embodiment will describe a modular data center which may avoid occurrence of a failure of an electronic device attributed to dew condensation.

EMBODIMENT

Figure 1:
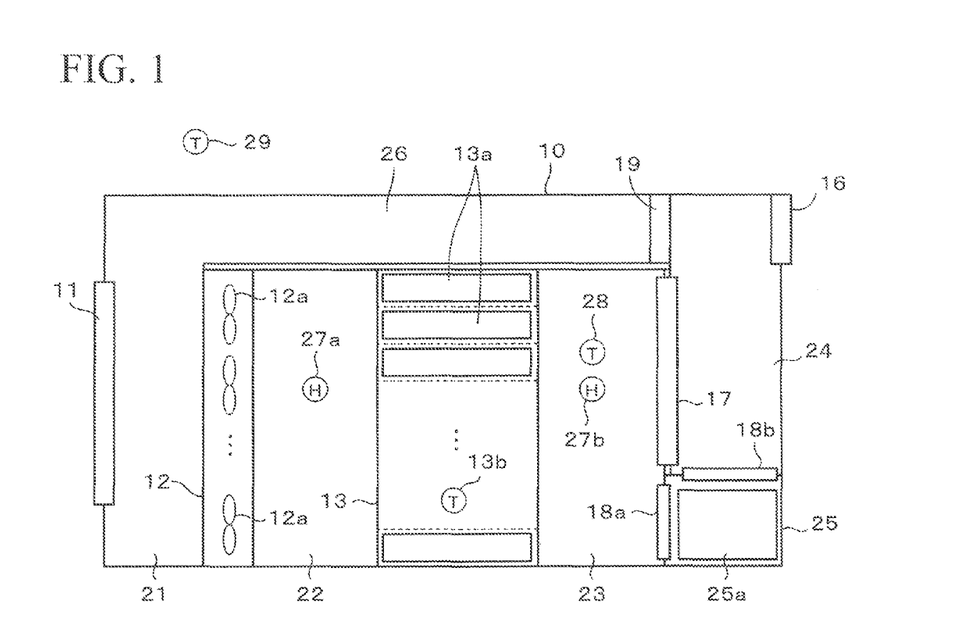
FIG. 1 is a schematic side view illustrating an example of a modular data center according to an embodiment.
Figure 2:
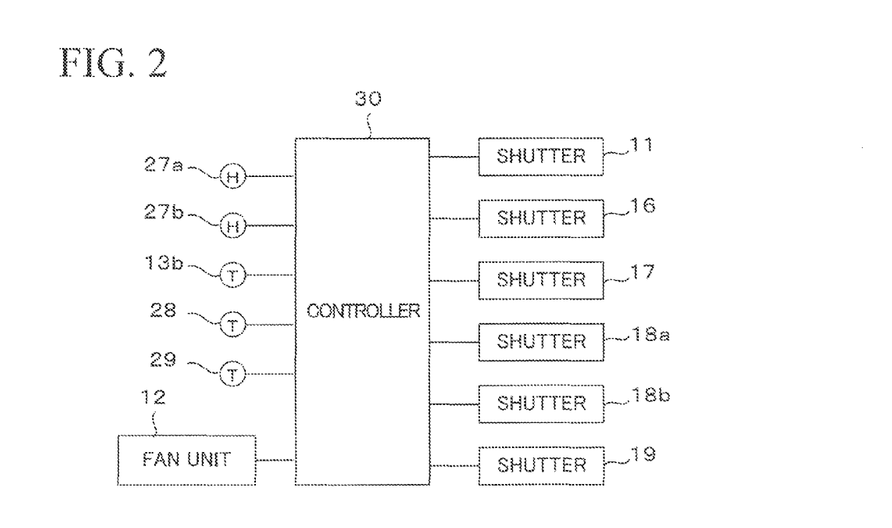
FIG. 2 is a block diagram illustrating an airflow control system of the modular data center according to the embodiment.

FIG. 1 is a schematic side view illustrating an example of a modular data center according to an embodiment, and FIG. 2 is a block diagram illustrating an airflow control system of the data center.

In the modular data center illustrated as an example in FIG. 1, a cooling fan unit 12 and a plurality of racks 13 are arranged inside a container 10 having a rectangular parallelepiped shape.

Of two wall surfaces of the container 10 opposed to each other, an intake port to which a shutter 11 is attached is provided on one wall surface while an exhaust port to which a shutter 16 is attached is provided on the other wall surface.

The shutters 11 and 16 are opened and closed by signals outputted from a controller 30. A space inside the container 10 connects to an outside space when one or both of the shutters 11 and 16 are opened. The space in the container is closed off to the outside space when both of the shutters 11 and 16 are closed.

Servers 13a are housed in each of the racks 13. Moreover, each rack 13 is provided with a temperature sensor 13b which detects a temperature of the servers 13a. An output from the temperature sensor 13b is transmitted to the controller 30. Here, each server 13a is an example of an electronic device. Other electronic devices such as storage units or power units may be housed in the racks 13. Meanwhile, the temperature sensor 13b is an example of an in-rack temperature detector.

A plurality of cooling fans 12a are provided to the cooling fan unit 12. Each of the cooling fans 12a may be switched to rotate forward or reverse and its drive is controlled by the controller 30. In this embodiment, rotation of the cooling fans 12a which causes air to flow from the cooling fan unit 12 toward the racks 13 is referred to as forward rotation while rotation in the opposite direction is referred to as reverse rotation. The cooling fan unit 12 is an example of a blower device.

The space in the container 10 is separated into an outside air introduction section 21, a cold aisle 22, a first hot aisle 23, a second hot aisle 24, a moisture absorption section 25, and a warm air circuit 26.

The outside air introduction section 21 is a space between the wall surface of the container 10, on which the shutter 11 is provided, and the cooling fan unit 12. Meanwhile, the cold aisle 22 is a space between the cooling fan unit 12 and the racks 13. Further, the first hot aisle 23 is a space located on an opposite side of the racks 13 from the cold aisle 22.

The second hot aisle 24 and the moisture absorption section 25 belongs to a space between the first hot aisle 23 and the wall surface of the container 10 on which the shutter 16 is provided. A lower part of the space is the moisture absorption section 25 while an upper part thereof is the second hot aisle 24.

A shutter 17 is provided between the first hot aisle 23 and the second hot aisle 24. Meanwhile, a shutter 18a is provided between the first hot aisle 23 and the moisture absorption section 25, and a shutter 18b is provided between the moisture absorption section 25 and the second hot aisle 24. The shutters 17, 18a, and 18b are also opened and closed by signals outputted from the controller 30.

A moisture absorbent 25a is disposed in the moisture absorption section 25. For example, zeolite, activated carbon, silica gel, or a polymer moisture absorbent which may be renewed (dried) relatively at a low temperature is used as the moisture absorbent 25a. The moisture absorbent 25a preferably applies one which is designed to exert a favorable moisture absorption performance at a temperature below 40° C., and to discharge the absorbed moisture for renewal when the temperature is equal to or above 40° C. and a humidity is equal to or below 30% RH, for example.

The warm air circuit 26 is a space provided above the cooling fan unit 12, the cold aisle 22, the racks 13, and the first hot aisle 23. The warm air circuit 26 connects the second hot aisle 24 and the outside air introduction section 21. A shutter 19 is provided to the warm air circuit 26. The shutter 19 is also opened and closed by signals outputted from the controller 30.

A humidity sensor 27a configured to detect a humidity of air in the cold aisle 22 is provided to the cold aisle 22. Meanwhile, a temperature sensor 28 configured to detect a temperature of air in the first hot aisle 23 and a humidity sensor 27b configured to detect a humidity thereof are provided to the first hot aisle 23. Outputs from the humidity sensors 27a and 27b and from the temperature sensor 28 are transmitted to the controller 30.

Furthermore, a dew-point temperature sensor 29 configured to detect a dew-point temperature of outside air is installed outside the container 10. An output from the dew-point temperature sensor 29 is also transmitted to the controller 30. The dew-point temperature sensor 29 is an example of a dew-point temperature detector. Here, a set of a temperature sensor and a humidity sensor, the temperature sensor configured to detect a temperature of the outside air and the humidity sensor configured to detect a relative humidity, a device which may measure an absolute humidity, or the like may be installed instead of the dew-point temperature sensor 29, and the dew-point temperature may be detected by using outputs therefrom.

Here, the outside air introduction section 21 and the cold aisle 22 are collectively an example of a first space while the first hot aisle 23 is an example of a second space. Moreover, the second hot aisle 24 is an example of a third space while the moisture absorption section 25 is an example of a fourth space. Furthermore, the warm air circuit 26 is an example of a fifth space.

In the meantime, the shutter 11 is an example of a first shutter, the shutter 16 is an example of a second shutter, and the shutter 17 is an example of a third shutter.

Moreover, the shutter 18a is an example of a fourth shutter, the shutter 18b is an example of a fifth shutter, and the shutter 19 is an example of a sixth shutter 19.

Figure 3A:
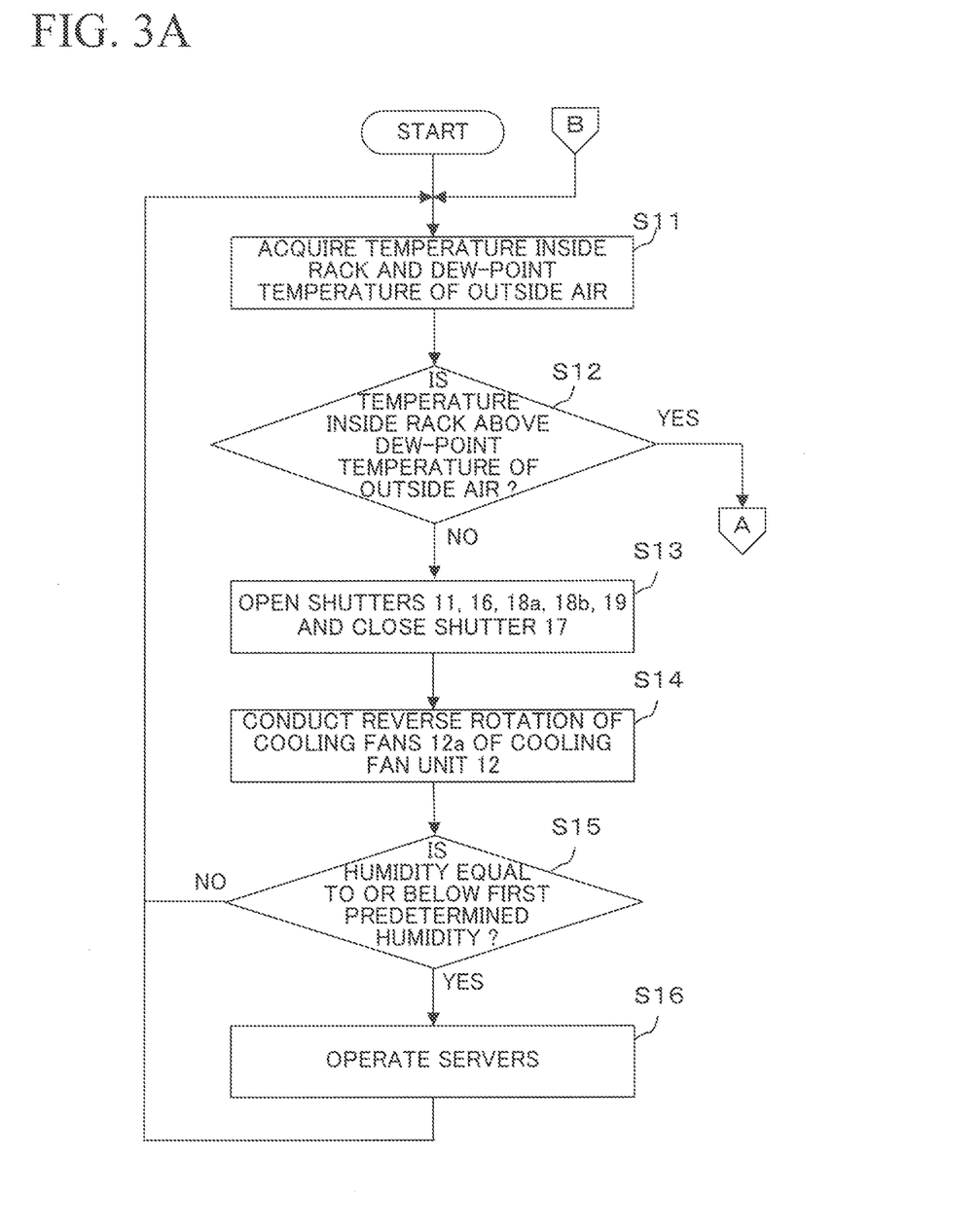
FIGS. 3A and 3B are flowcharts illustrating airflow control in the data center of the embodiment.
Figure 3B:
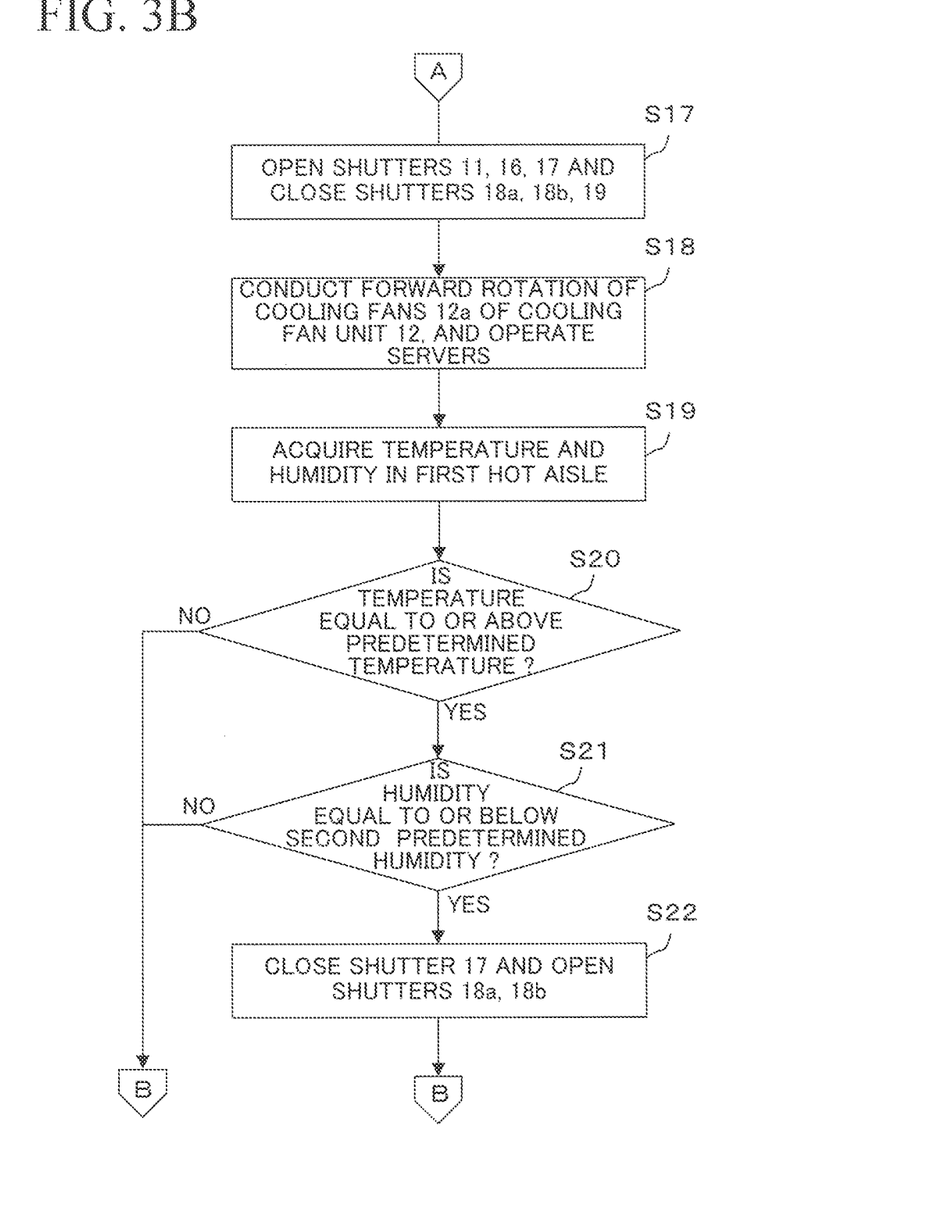

Now, air flow control in the data center of the embodiment will be described below with reference to flowcharts illustrated in FIGS. 3A and 3B. Here, the servers 13a are assumed to be stopped in an initial state.

First, in step S11, the controller 30 acquires data on the temperature inside each rack 13 from the temperature sensor 13b and acquires data on the dew-point temperature of the outside air from the dew-point temperature sensor 29.

Next, in step S12, the controller 30 compares the temperature inside the rack 13 acquired from the temperature sensor 13b with the dew-point temperature of the outside air acquired from the dew-point temperature sensor 29. Then, step S13 takes place when the temperature inside the rack 13 is equal to or below the dew-point temperature of the outside air (in the case of NO) or step S17 takes place when the temperature inside the rack 13 is above the dew-point temperature of the outside air (in the case of YES). An operation stand-by mode is established when step S13 takes place, and a normal operation mode is established when step S17 takes place.

When the control moves from step S12 to step S13, i.e., when the temperature inside the rack 13 is equal to or below the dew-point temperature of the outside air, dew condensation may occur inside the servers 13a if the outside air is introduced into the rack 13, and may lead to a breakdown or a failure. In this case, the controller 30 opens the shutters 11, 16, 18a, 18b, and 19 and closes the shutter 17. Thereafter, the control moves to step S14 where the controller 30 conducts reverse rotation of the cooling fans 12a of the cooling fan unit 12.

Figure 4:
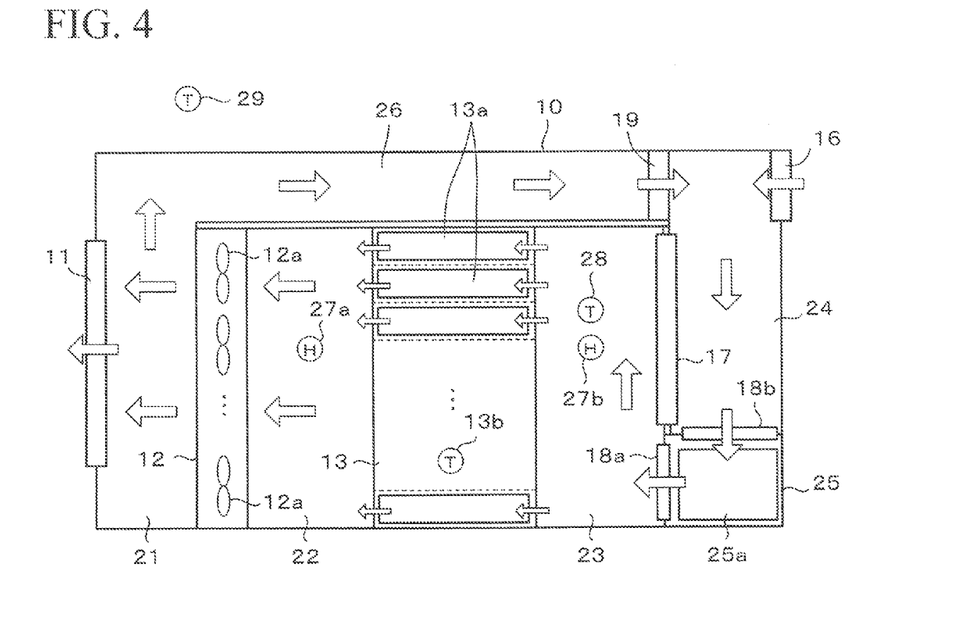
FIG. 4 is a first view illustrating airflow when a temperature inside a rack is equal to or below a dew-point temperature of outside air.

FIG. 4 is a view illustrating airflow in this case. Outline arrows in FIG. 4 indicate flowing directions of the air.

By putting the cooling fans 12a of the cooling fan unit 12 into the reverse rotation, a pressure in the cold aisle 22 is reduced while a pressure in the outside air introduction section 21 is increased. Thus, part of the air in the outside air introduction section 21 is discharged to the outside through the shutter 11 while the rest of the air moves to the second hot aisle 24 through the warm air circuit 26.

In the meantime, the air in the amount equivalent to that discharged to the outside through the shutter 11 flows from the outside into the second hot aisle 24 through the shutter 16. Then, the air in the second hot aisle 24 moves to the first hot aisle 23 through the moisture absorption section 25, and then moves to the cold aisle 22 through the rack 13.

The air passing through the moisture absorption section 25 is deprived of moisture by the moisture absorbent 25a and thus becomes dry. In addition, heat is generated when the moisture absorbent 25a absorbs the moisture. As a consequence, the temperature of the air after passing through the moisture absorption section 25 becomes higher than the temperature of the air before passing through the moisture absorption section 25. The air thus deprived of the moisture and having the higher temperature is introduced into the rack 13, and dew condensation inside the servers 13a is avoided as a consequence.

Figure 5:
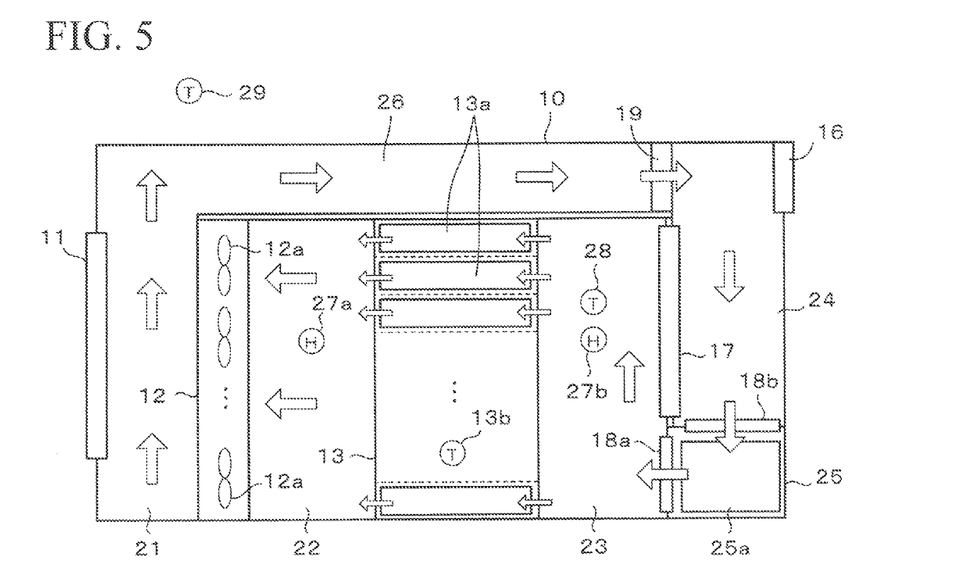
FIG. 5 is a second view illustrating airflow when the temperature inside the rack is equal to or below the dew-point temperature of the outside air.

Although part of the outside air is taken into the container 10 by opening the shutters 11 and 16 in this embodiment, the shutters 11 and 16 may be closed instead. FIG. 5 is a schematic view illustrating airflow inside the container 10 in this case. In this case as well, the temperature of the air in the container 10 is increased by the heat generated by the moisture absorbent 25a or the heat generated in association with the operation of the cooling fan unit 12.

The cooling fan unit 12 is operated in step S14, and then step S15 takes place. In step S15, the controller 30 acquires data on the humidity of the air in the first hot aisle 23 from the humidity sensor 27b, and determines whether or not the humidity of the air in the first hot aisle 23 is equal to or below a first predetermined humidity (such as 80% RH). The control returns to step S11 when the humidity of the air in the first hot aisle 23 is determined to be above the first predetermined humidity (in the case of NO).

On the other hand, when the humidity of the air in the first hot aisle 23 is determined to be equal to or below the first predetermined humidity (in the case of YES) in step S15, there is no risk of occurrence of dew condensation inside the servers 13a. Accordingly, the control moves to step S16 and the servers 13a are operated.

When the servers 13a are operated in step S16, a large amount of heat is generated in association with the operation of the servers 13a. As a consequence, the temperature of the air in the container 10 is rapidly increased. After the servers 13a are operated in step S16, the control returns to step S11.

The procedure from step S11 to step S16 will be repeated until the temperature inside the rack 13 is determined to be above the dew-point temperature of the outside air in step S12.

When the temperature inside the rack 13 is determined to be above the dew-point temperature of the outside air (in the case of YES) in step S12, the control moves to step S17 (a normal operation mode). When step S17 takes place, the controller 30 opens the shutters 11, 16, and 17 and closes the shutter 19. In addition, the controller 30 closes the shutters 18a and 18b, thereby establishing a hermetically closed state of the moisture absorption section 25.

Thereafter, the control moves to the step S18 where the controller 30 conducts forward rotation of the cooling fans 12a of the cooling fan unit 12 and operates the servers 13a in the rack 13. Nonetheless, if the servers 13a are already in operation, then the controller 30 maintains the operating state.

Figure 6:
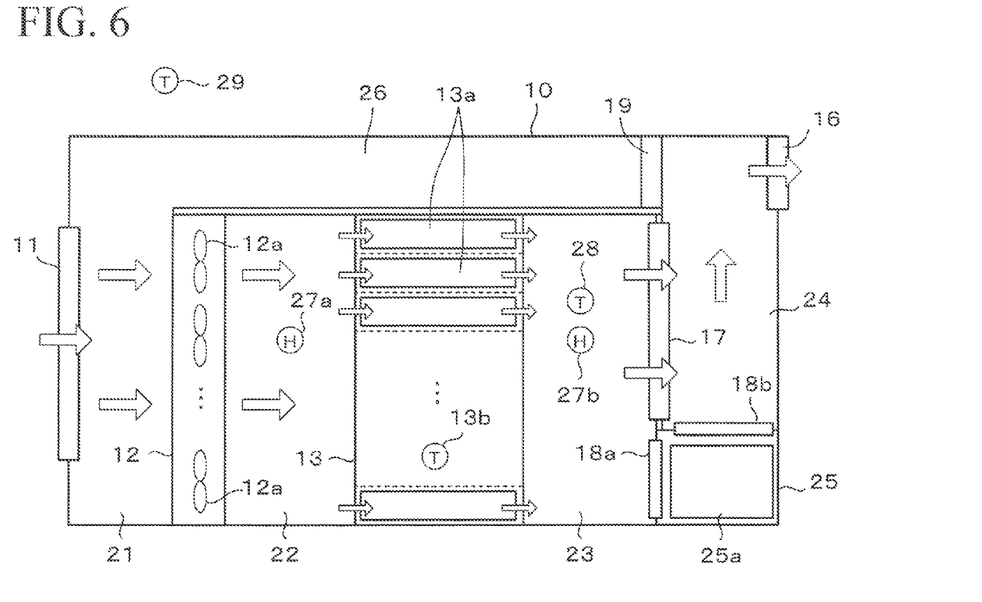
FIG. 6 is a first view illustrating airflow when the temperature inside the rack is above the dew-point temperature of the outside air.

FIG. 6 is a view illustrating airflow in this case. As illustrated in FIG. 6, the outside air (the air) is introduced into the outside air introduction section 21 through the shutter 11, and the air in the outside air introduction section 21 moves to the cold aisle 22 by using the cooling fan unit 12. Then, the air moves to the first hot aisle 23 through the rack 13, and moves further to the second hot aisle 24 through the shutter 17. Eventually, the air is discharged to the outside through the shutter 16.

When the control moves from step S12 to step S17, the temperature inside the rack 13 is higher than the dew-point temperature of the outside air. Accordingly, there is no risk of occurrence of dew condensation inside the servers 13a even when the outside air is introduced into the rack 13.

Figure 7:
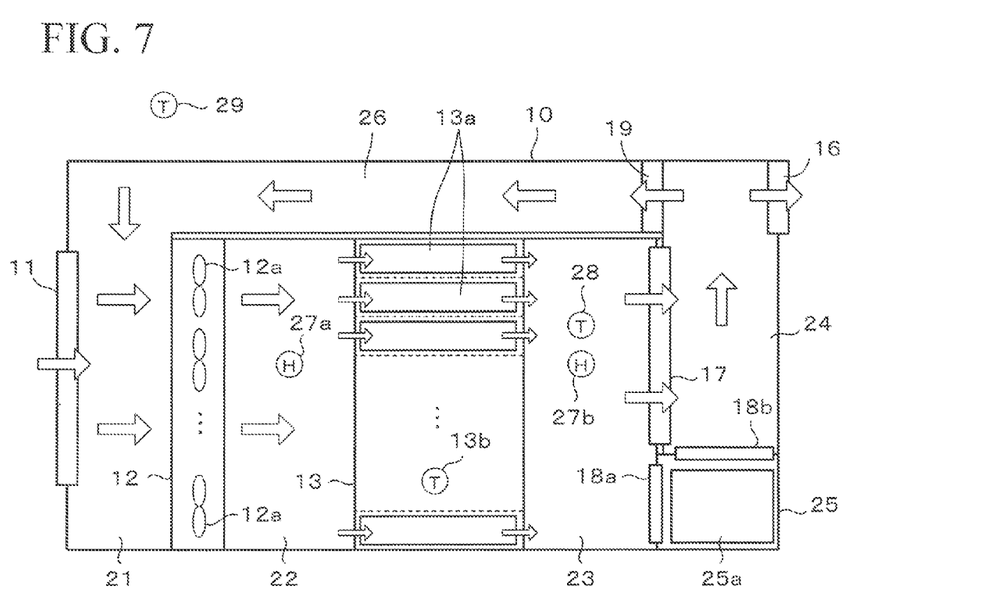
FIG. 7 is a second view illustrating airflow when the temperature inside the rack is above the dew-point temperature of the outside air.

Here, when the outside air temperature is low, the shutter 19 may be opened so as to return part of the air in the second hot aisle 24 to the outside air introduction section 21. FIG. 7 is a view illustrating air flow when the shutter 19 is opened.

Next, the control moves to step S19 where the controller 30 acquires the temperature and the humidity of the air in the first hot aisle 23 from the temperature sensor 28 and the humidity sensor 27b. Then, the control moves to step S20 where the controller 30 determines whether or not the temperature of the air in the first hot aisle 23 is equal to or above a predetermined temperature (such as 40° C.). The control returns to step S11 when the temperature of the air in the first hot aisle 23 is determined to be below the predetermined temperature (in the case of NO).

On the other hand, the control moves to step S21 when the temperature of the air in the first hot aisle 23 is determined to be equal to or above the predetermined temperature (in the case of YES) in step S20.

In step S21, the controller 30 determines whether or not the humidity of the air in the first hot aisle 23 is equal to or below a second predetermined humidity (such as 30% RH). Then, the control returns to step S11 when the humidity of the air in the first hot aisle 23 is determined to be above the second predetermined humidity (in the case of NO).

On the other hand, the control moves to step S22 when the humidity of the air in the first hot aisle 23 is determined to be equal to or below the second predetermined humidity (in the case of YES) in step S21. In step S22, the controller 30 closes the shutter 17 and opens the shutters 18a and 18b. Thereafter, the control returns to step S11 to continue the processing.

Figure 8:
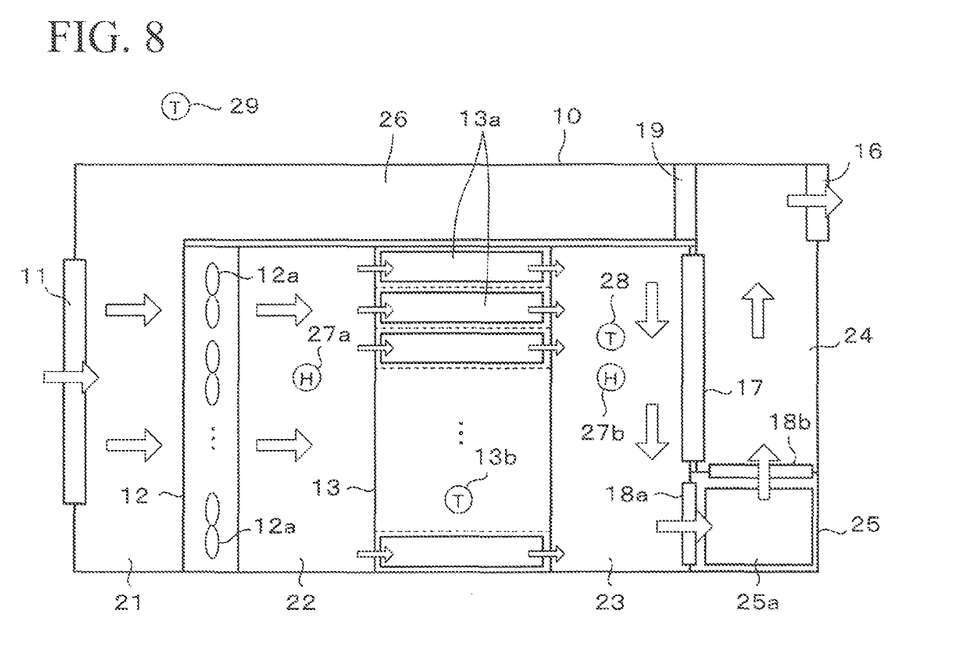
FIG. 8 is a view illustrating airflow when air in a first hot aisle has a temperature equal to or above a predetermined temperature and has a humidity equal to or below a predetermined humidity.

FIG. 8 is a view illustrating airflow when the shutter 17 is closed and the shutters 18a and 18b are opened in step S22. In this state, the air having the temperature equal to or above the predetermined temperature and the humidity equal to or below the second predetermined humidity passes through the moisture absorption section 25. As a consequence, the moisture evaporates from the moisture absorbent 25a and the moisture absorbent 25a is thus renewed (dried).

As described above, in this embodiment, the operation stand-by mode is established when the temperature inside the rack 13 is equal to or below the dew-point temperature of the outside air, and the air deprived of the moisture as a consequence of the passage through the moisture absorption section 25 is fed into the rack 13. In this way, it is possible to increase the temperature inside the rack 13 while avoiding occurrence of dew condensation inside the rack 13.

Moreover, in this embodiment, the normal operation mode is established when the temperature inside the rack 13 is above the dew-point temperature of the outside air. In the normal operation mode, the cooling fans 12a of the cooling fan unit 12 are rotated in the forward direction, and the servers 13a in the rack 13 are cooled by the outside air taken into the container 10 through the shutter 11. Thus, it is possible to cool the servers 13a with less power and thus to reduce power consumption of the data center.

Furthermore, in this embodiment, when the temperature of the air discharged from the rack 13 is above the predetermined temperature and the humidity thereof is below the second predetermined humidity, the air discharged from the rack 13 is fed into the moisture absorption section 25. Thus, the moisture absorbed in the moisture absorbent 25a evaporates and the moisture absorbent 25a is renewed (dried). Accordingly, the moisture absorbent 25a may be reused many times so as to reduce its running cost.

A description will be hereinbelow provided for experiments to examine the occurrence of dew condensation by actually operating the modular data center of to this embodiment.

Experiment 1

The modular data center having the structure illustrated in FIG. 1 is put to use while disposing 10 kg of zeolite as the moisture absorbent 25a in the moisture absorption section 25.

When the outside air temperature is 5° C., the outside air humidity is 100% RH, and the dew-point temperature of the outside air is 5° C., the temperature inside the rack 13 with the servers 13a in the stopped state is 3° C.

Since the temperature inside the rack 13 is below the dew-point temperature of the outside air, the air is fed into the container 10 as illustrated in FIG. 4 by conducting the reverse rotation of the cooling fans 12a of the cooling fan unit 12. The humidity of the air passing through the moisture absorption section 25 is reduced to about 70% RH, and the humidity (the humidity at 3° C.) inside the rack 13 becomes equal to about 80% RH.

Since the humidity inside the rack 13 is equal to or below a predetermined value (80% RH), the servers 13a are put into operation. When the servers 13a start the operation, the temperature inside the rack 13 is increased to 10° C. due to the heat generated by the servers 13a.

Since the temperature inside the rack 13 exceeds the dew-point temperature of the outside air, the rotation of the cooling fans 12a of the cooling fan unit 12 is changed to the forward rotation. In the meantime, the shutter 17 is opened and the shutters 18a and 18b are closed. Thus, the airflow inside the container 10 turns into the one illustrated in FIG. 6. As a consequence, the servers 13a are successfully operated while avoiding dew condensation inside the servers 13a.

Experiment 2

The modular data center having the structure illustrated in FIG. 1 is put to use while disposing 10 kg of ecoPoD (registered trademark) polymer sorbent manufactured by Okayama Eco Energy Gijutsu Kenkyusho KK. as the moisture absorbent 25a into moisture absorption section 25.

When the outside air temperature is 5° C., the outside air humidity is 100% RH, and the dew-point temperature of the outside air is 5° C., the temperature inside the rack 13 with the servers 13a in the stopped state is 3° C.

Since the temperature inside the rack 13 is below the dew-point temperature of the outside air, the air is fed into the container 10 as illustrated in FIG. 4 by conducting the reverse rotation of the cooling fans 12a of the cooling fan unit 12. The humidity of the air passing through the moisture absorption section 25 is reduced to about 70% RH, and the humidity (the humidity at 3° C.) inside the rack 13 becomes equal to about 80% RH.

Since the humidity inside the rack 13 is equal to or below the predetermined value (80% RH), the servers 13a are put into operation. When the servers 13a start the operation, the temperature inside the rack 13 is increased to 10° C. due to the heat generated by the servers 13a.

Since the temperature inside the rack 13 exceeds the dew-point temperature of the outside air, the rotation of the cooling fans 12a of the cooling fan unit 12 is changed to the forward rotation. In the meantime, the shutter 17 is opened and the shutters 18a and 18b are closed. Thus, the airflow inside the container 10 turns into the one illustrated in FIG. 6. As a consequence, the servers 13a are successfully operated while avoiding dew condensation inside the servers 13a.

Thereafter, the temperature of the air in the first hot aisle 23 reaches 45° C. and the humidity thereof reaches 25% RH. Hence the shutter 17 is closed and the shutters 18a and 18b are opened. Thus, the air is fed into the moisture absorption section 25 and the moisture absorbent 25a is renewed (dried).

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A modular data center comprising:
   a structure provided with an intake port and an exhaust port, the ports being connected to outside;
   a first shutter provided to the intake port, and made openable and closable;
   a second shutter provided to the exhaust port, and made openable and closable;
   a rack disposed in the structure and configured to house an electronic device;
   a blower device capable of switching a flowing direction of air, the blower device being disposed in the structure and configured to feed the air into the rack;
   a first space provided between the first shutter and the rack;
   a second space provided on an opposite side of the rack from the first space;
   a third space provided between the second space and the second shutter;
   a fourth space located adjacent to the second space and the third space, and housing a moisture absorbent inside;
   a third shutter provided between the second space and the third space, and made openable and closable;
   a fourth shutter provided between the second space and the fourth space, and made openable and closable;
   a fifth shutter provided between the third space and the fourth space, and made openable and closable;
   an in-rack temperature detector configured to detect a temperature inside the rack;
   a dew-point temperature detector configured to detect a dew-point temperature of outside air; and
   a controller configured to receive signals inputted from the in-rack temperature detector and the dew-point temperature detector, and to control the first shutter, the second shutter, the third shutter, the fourth shutter, the fifth shutter, and the blower device.

2. The modular data center according to claim 1, wherein the controller closes the third shutter and opens the fourth shutter and the fifth shutter, and operates the blower device such that the air flows from the second space to the first space through the rack, when the temperature inside the rack detected by the in-rack temperature detector is equal to or below the dew-point temperature of the outside air detected by the dew-point temperature detector, and
   the controller opens the third shutter and closes the fourth shutter and the fifth shutter, and operates the blower device such that the air flows from the first space to the second space through the rack, when the temperature inside the rack detected by the in-rack temperature detector is above the dew-point temperature of the outside air detected by the dew-point temperature detector.

3. The modular data center according to claim 2, wherein the controller operates the electronic device housed in the rack when the temperature inside the rack detected by the in-rack temperature detector is above the dew-point temperature of the outside air detected by the dew-point temperature detector.

4. The modular data center according to claim 2, further comprising:
   a temperature sensor configured to detect a temperature of air in the second space; and
   a humidity sensor configured to detect a humidity of the air in the second space, wherein
   the controller closes the third shutter and opens the fourth shutter and the fifth shutter when the temperature of the air in the second space is equal to or above a predetermined temperature and the humidity in the second space is equal to or below a predetermined humidity.

5. The modular data center according to claim 1, further comprising:
   a fifth space connecting the first space and the third space; and
   a sixth shutter located in the fifth space and configured to be opened and closed by the controller.

6. The modular data center according to claim 1, wherein the moisture absorbent is any one of zeolite, activated carbon, silica gel, and a polymer moisture absorbent.

* * * * *